US005495513A

United States Patent [19]
Ramirez et al.

[11] Patent Number: 5,495,513
[45] Date of Patent: Feb. 27, 1996

[54] COUNTER CELL AND COUNTER CIRCUIT

[75] Inventors: Sergio R. Ramirez; Imran Baoai, both of Austin, Tex.

[73] Assignee: Advanced Micro Devices Inc., Sunnyvale, Calif.

[21] Appl. No.: 343,990

[22] Filed: Nov. 18, 1994

[51] Int. Cl.$^6$ ............................ H03K 21/02; H03K 23/44
[52] U.S. Cl. ............................ 377/111; 307/105; 307/114; 307/117
[58] Field of Search ..................................... 377/105, 111, 377/114, 121, 117

[56] References Cited

U.S. PATENT DOCUMENTS

| | | | |
|---|---|---|---|
| 4,974,241 | 11/1990 | McClure et al. | 377/111 |
| 5,159,616 | 10/1992 | Douglas et al. | 377/105 |
| 5,175,753 | 12/1992 | Gaglani | 377/105 |

*Primary Examiner*—John S. Heyman
*Attorney, Agent, or Firm*—Foley & Lardner

[57] ABSTRACT

A counter cell includes a latch circuit, control circuit, and a pull-up circuit. The latch circuit is formed of a first clocked half-latch, a second clocked half-latch and an inverter for storing a binary output signal. The first clocked half-latch is responsive to a first clock phase signal for transferring the binary output signal from its input to its output. The second clocked half-latch is responsive to a second clock phase signal for transferring a binary output signal from its input to its output. The control circuit is responsive to an input complement signal for selectively passing the first clock phase signal to the first clocked half-latch so as to permit toggling the state of the binary output signal. The control circuit requires only one transistor and two input signals to perform its required functions. When the input complement signal is High and the first phase input clock signal is High, an enable signal is sent to the first clocked half-latch, thereby enabling the count process. Any number of these counter cells can be arranged to form an N-bit counter circuit.

22 Claims, 6 Drawing Sheets

COUNTER CELL AND COUNTER CIRCUIT

BACKGROUND OF THE INVENTION

This invention relates generally to improved control circuitry for a counter circuit formed of a plurality of identical bit cells in which each bit cell is fabricated with a smaller number of components than has been traditionally available.

As is generally well known in the art, one of the most common ways to synchronize events occurring in digital logic circuitry is achieved by utilizing conventional counter circuits. These counter circuits are typically adapted to count up to a certain number of clock pulses. Further, such counter circuits may be operated on straight binary counting codes or any other suitable code arrangement. The number of counter cells or stages required depends upon the desired range of the counter circuit. Each of the counter cells corresponds to one bit of the counter circuit.

In a typical binary counting operation of an up counter, prior to starting the counting circuit, a reset signal is supplied to each of the counter cells so that each bit is initially set to "zero." Thereafter, at each cycle of the clock pulses the counter circuit counts up by one. For example, in the case of a 4-bit counter circuit, when the reset signal is applied, the values of the four bits will be set to 0000. Then, after each cycle of the clock pulses following the reset signal, the values of the four bits will be changed to: 0001, 0010, 0011, and so on.

Many conventional counter circuits employ two-phase clocking signals or pulses, with a carry chain. A counter circuit of this type is described in U.S. Pat. No. 5,175,753, issued to Gaglani, entitled 'Counter Cell Including a Latch Circuit, Control Circuit and a Pull-Up Circuit'.

Gaglani discloses a counter cell which includes a latch circuit, a control circuit, and a pull-up circuit. FIG. 1 herein is a schematic circuit diagram of a counter cell as disclosed in Gaglani. The latch circuit stores a binary output signal. The latch circuit is formed of a first clocked half-latch having an input and an output, a second clocked half-latch having its input connected to the output of the first clocked half-latch and an output, and an inverter having its input connected to the output of the second clocked half-latch and its output connected to the input of the first clocked half-latch. The first clocked half-latch includes N2, INV3, and INV2 of FIG. 1. The second clocked half-latch includes N3, INV4, and INV5 of FIG. 1. The inverter portion of the half-latch is shown as INV1 in FIG. 1. The first clock phase signal, PH1, is input to the gate of transistor N2, and the second clock phase signal, PH2, is input to the gate of transistor N3. The first clocked half-latch is responsive to a first clock phase signal for transferring the binary output signal from its input to its output. The second clocked half-latch is responsive to a second clock phase signal for transferring the binary output signal from its input to its output.

The control circuit is responsive to an input complement signal ICMPL for selectively passing the first clock phase signal to the first clocked half-latch to permit toggling the state of the binary output signal OUT. The pull-up circuit is responsive to the binary output signal OUT and the input complement signal ICMPL for generating an output complement signal OCMPL. The logic value of the output complement signal OCMPL is maintained at a high logic level when the binary output signal OUT is at a low logic level.

The control circuit as disclosed in Gaglani will now be described in detail, with references made to FIG. 1. The control circuit includes the discharging transistor N1 and the inhibit transistor P3. When the input complement signal ICMPL is set to a High Value, inhibit transistor P3 is turned off. When ICMPL is set to a Low Value, P3 is turned on. When the first clock phase signal PH1 is low, the inverted first clock phase signal PH1L is High. When PH1L is High, discharging transistor N1 is turned on. The effect of transistors P3 and N1 is to apply a high voltage to the gate of transistor N2, thereby enabling the first clocked half-latch only when ICMPL is low and PH1 is High. In all other cases, the potential applied at the gate of N2 is low, and so N2 is in the cutoff state. When N2 is in the cutoff state, the first clocked half-latch is not enabled, and a signal does not pass from the source of N2 to the drain of N2. When the first clocked half-latch is enabled, N2 is conductive and a signal passes from the source of N2 to the drain of N2.

FIG. 2 is a block diagram of a 4-bit counter circuit using counter circuits of Gaglani. All counter cells except the least significant bit counter cell 12 require an inverted first clock phase signal PH1L as an input for the control circuit. This requires an inverter T4 on the first clock phase PH1 input in order to create the inverted first clock phase PH1L that is applied to input I4 of counter 14-1, 14-2 and 14-3.

A plurality of counter cells can be arranged to form an N-bit up-counter, similar to the structure of the 4-bit up-counter shown in FIG. 2. According to a counter cell as disclosed in Gaglani, an N-bit binary counter requires 13 transistors in the first cell, 18*(N−2) transistors in the middle cells, and 15 transistors in the last cell. This counter also requires 2 transistors in inverter T3, 2 transistors in inverter TG, and 2 transistors in transmission gate TG (transistor N4 and P4 in FIG. 1). Therefore, the total transistor count for an N-bit counter of the prior art is 18N−2 transistors.

It would therefore be desirable to provide an improved counter circuit which contains a plurality of identical bit cells, each cell being formed with a smaller number of components than has been traditionally required. Further, it also would be expedient to construct each bit cell to be of a regular configuration or structure so as to conform to a repeatable pattern suitable for very large scale integration (VLSI) with high packing density.

SUMMARY OF THE INVENTION

Accordingly, it is a general object of the present invention to provide an improved counter circuit which is relatively simple and economical to manufacture and assemble.

In accordance with these aims and objectives, a circuit according to the invention is concerned with the provision of a counter cell. The counter cell according to the invention has a first clocked half-latch formed of a first pass transistor and a pair of first and second inverters. A second clocked half-latch is formed of a second pass transistor and a pair of third and fourth inverters. A fifth inverter has an input and an output for storing a bit signal at a first output terminal. The first pass transistor has a drain connected to an input of the first inverter and a gate connected to a first input terminal for receiving a first clock phase signal. The first inverter has an output connected to an input of the second inverter. The second inverter has an output connected to the input of the first inverter. The second pass transistor has a source connected to an output of the first inverter and a drain connected to an input of the third inverter, the third inverter having an output connected to an input of the fourth inverter and to the input of the fifth inverter. The fourth inverter has an output connected to the input of the third inverter. An inhibit transistor has a source connected to the output of the fifth inverter, a drain connected to a source of the first pass transistor, and a gate connected to a second input terminal for receiving an input complement signal. A transmission gate is formed of a P-channel transistor and an N-channel transistor having sources which are connected to the gate of the inhibit transistor and having drains which are connected to a second output terminal to provide an output complement signal. The P-channel transistor has a gate connected to the output of the third inverter, and the N-channel transistor has a gate connected to the first output terminal. A pull-up transistor has a source connected to a supply potential and a drain connected to the second output terminal, a gate of the pull-up transistor being connected to the first output terminal.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DETAILED DESCRIPTION OF THE PREFERRED EMBODIMENTS

Figure 2:
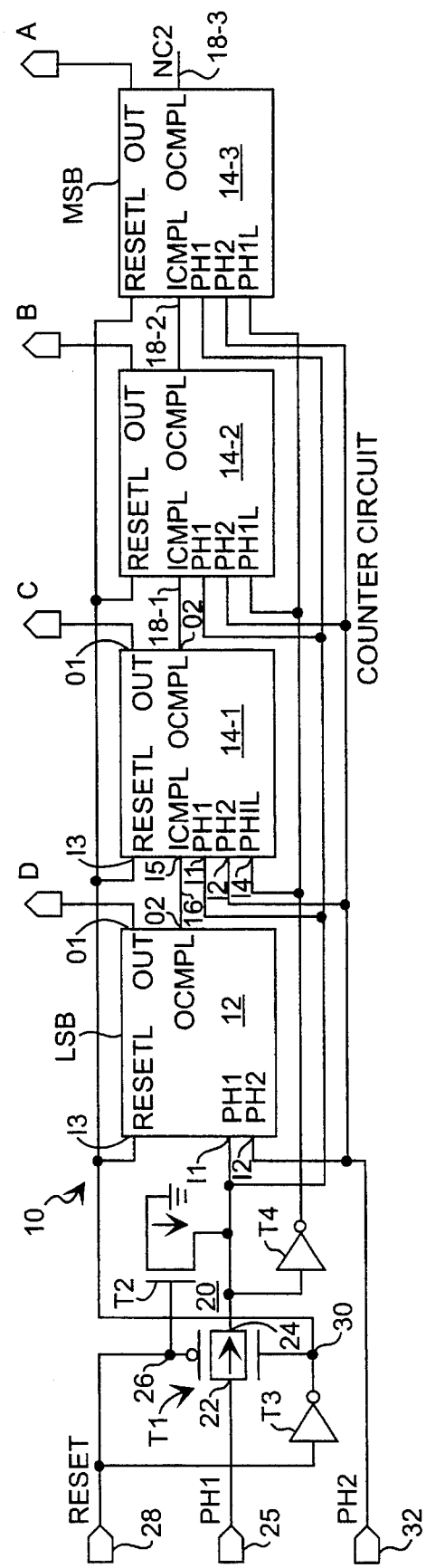
FIG. 2 is a block diagram of a conventional 4-bit counter circuit.
Figure 3:
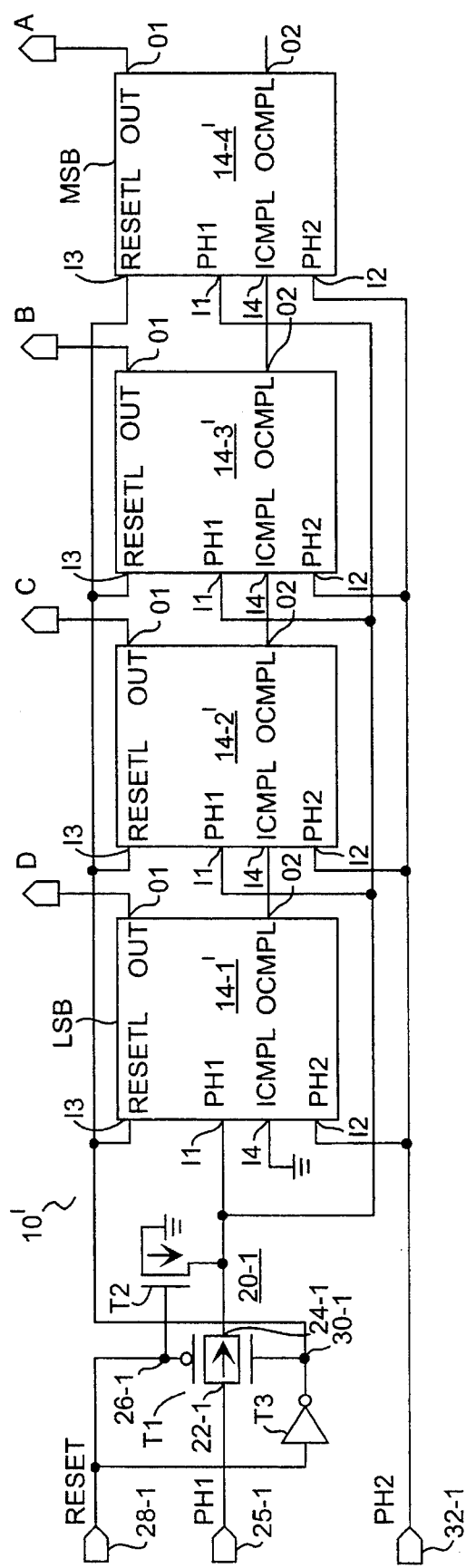
FIG. 3 is a schematic circuit diagram of a 4-bit counter circuit according to a first embodiment of the invention.

Referring now in detail to the drawings, there is shown in FIG. 3 a block diagram of a 4-bit counter circuit constructed in accordance with a first embodiment of the invention. The counter circuit 10' of FIG. 3 includes a 4-bit up-counter which is exemplary of the invention. The counter circuit 10' includes four identical counter stages designated as 14-1', 14-2', 14-3' and 14-4'. The 4-bit counter circuit 10' includes four identical counter cells for the four bits, i.e., one counter cell for each counter stage. Unlike the 4-bit counter 10 shown in FIG. 2, the 4-bit counter circuit 10' according to the invention does not require a different type of counter cell for the least significant bit stage. The counter cell according to the invention is discussed further herein. It will be understood by those skilled in the art that the desired range of the counter circuit determines the number of counter stages required.

Each of the counter stages 14-1', 14-2', 14-3' and 14-4' is constructed with a relatively small number of circuit components so as to use a reduced amount of semiconductor chip area, thereby reducing manufacturing costs and power dissipation. Further, the counter stages 14-1', 14-2', 14-3' and 14-4' are constructed of a regular configuration suitable for use in large scale integrated circuit arrays which may be mass produced and may also be formed as a part of a monolithic semiconductor integrated circuit.

The first counter stage 14-1' accepts four input signals. These include a first input clock phase signal PH1 on input terminal I1, a second input clock phase signal PH2 on input terminal I2, the complement RESETL of a reset signal RESET on input terminal I3, and an input complement signal ICMPL on input terminal I4. For the first counter stage 14-1', a ground potential is applied to the ICMPL input. The first counter stage 14-1' provides an output bit signal OUT on an output terminal O1, which represents the least significant bit D, and an output complement signal OCMPL on an output terminal O2 which is connected to input terminal I4 of the second counter stage 14-2'.

The second, third and fourth counter stages 14-2', 14-3' and 14-4' receive the same three input signals PH1, PH2 and RESETL, plus an input complement signal ICMPL The counter stages 14-2', 14-3' and 14-4' also provide corresponding output complement signals OCMPL and output bit signals OUT. It will be noted that the input terminal I4 which corresponds to ICMPL for each counter stage 14-2', 14-3' and 14-4' is connected to receive the corresponding output complement signal OCMPL of the preceding counter stage. The output complement signal OCMPL of the last counter stage 14-4' is left unconnected. The counter stages 14-2', 14-3' and 14-4' also generate output bit signals OUT for the bits C, B and A, respectively, wherein the OUT signal for bit A represents the most significant bit (MSB).

The counter circuit according to the invention further includes a control section 20-1 formed of a transmission gate T1 and an N-channel MOS transistor T2. The transmission gate T1 is formed of a P-channel MOS transistor and an N-channel MOS transistor. The sources of the P-channel and N-channel transistors are connected to the control section's input node 22-1, and the drains thereof are connected to the control section's output node 24-1. The input node 22-1 is tied to an input terminal 25-1 for receiving the first clock phase signal PH1. The gate electrode of the P-channel transistor is electrically connected to a control node 26-1, which is connected to an input terminal 28-1 for receiving the reset signal RESET. The gate electrode of the N-channel transistor is electrically connected to a control node 30-1 and to the output of the inverter T3. The input of the inverter T3 is also connected to the input terminal 28-1 for receiving the reset signal RESET. The output of the inverter T3 defining the complement RESETL of the reset signal is also fed to the input terminal I3 of the respective counter stages 14-1,' 14-2', 14-3' and 14-4'.

The control node 26-1 is also connected to the gate electrode of the transistor T2. The transistor T2 has its drain electrode connected to the output node 24-1 of the transmission gate T1 and has its source electrode connected to a reference potential (ground). The output node 24-1 of the transmission gate T1 is also fed to the corresponding input terminal of the counter stages 14-1', 14-2', 14-3' and 14-4'. The second clock phase signal PH2 received on the input terminal 32-1 is applied to the PH2 input terminals I2 of the counter stages 14-1', 14-2', 14-3' and 14-4'.

The operation of counter circuits is well known in the art. While various types of code arrangements may be used, the typically binary code pattern is illustrated in the Table below. The code pattern in the Table is directed to a 4-bit, up-counter operation which provides sixteen counts (0–15).

TABLE

| | Counting Sequence of Operation Column Bit | | | |
|---|---|---|---|---|
| COUNT | A | B | C | D |
| 0 | 0 | 0 | 0 | 0 |
| 1 | 0 | 0 | 0 | 1 |
| 2 | 0 | 0 | 1 | 0 |
| 3 | 0 | 0 | 1 | 1 |
| 4 | 0 | 1 | 0 | 0 |
| 5 | 0 | 1 | 0 | 1 |
| 6 | 0 | 1 | 1 | 0 |
| 7 | 0 | 1 | 1 | 1 |
| 8 | 1 | 0 | 0 | 0 |
| 9 | 1 | 0 | 0 | 1 |
| 10 | 1 | 0 | 1 | 0 |
| 11 | 1 | 0 | 1 | 1 |
| 12 | 1 | 1 | 0 | 0 |
| 13 | 1 | 1 | 0 | 1 |
| 14 | 1 | 1 | 1 | 0 |
| 15 | 1 | 1 | 1 | 1 |

In order to achieve the same functionality as the counter cell of the prior art with the use of a smaller number of circuit components, the control circuitry according to the invention has been changed so as to perform the same functions as the control circuitry of the prior art, but with fewer components.

Figure 4:
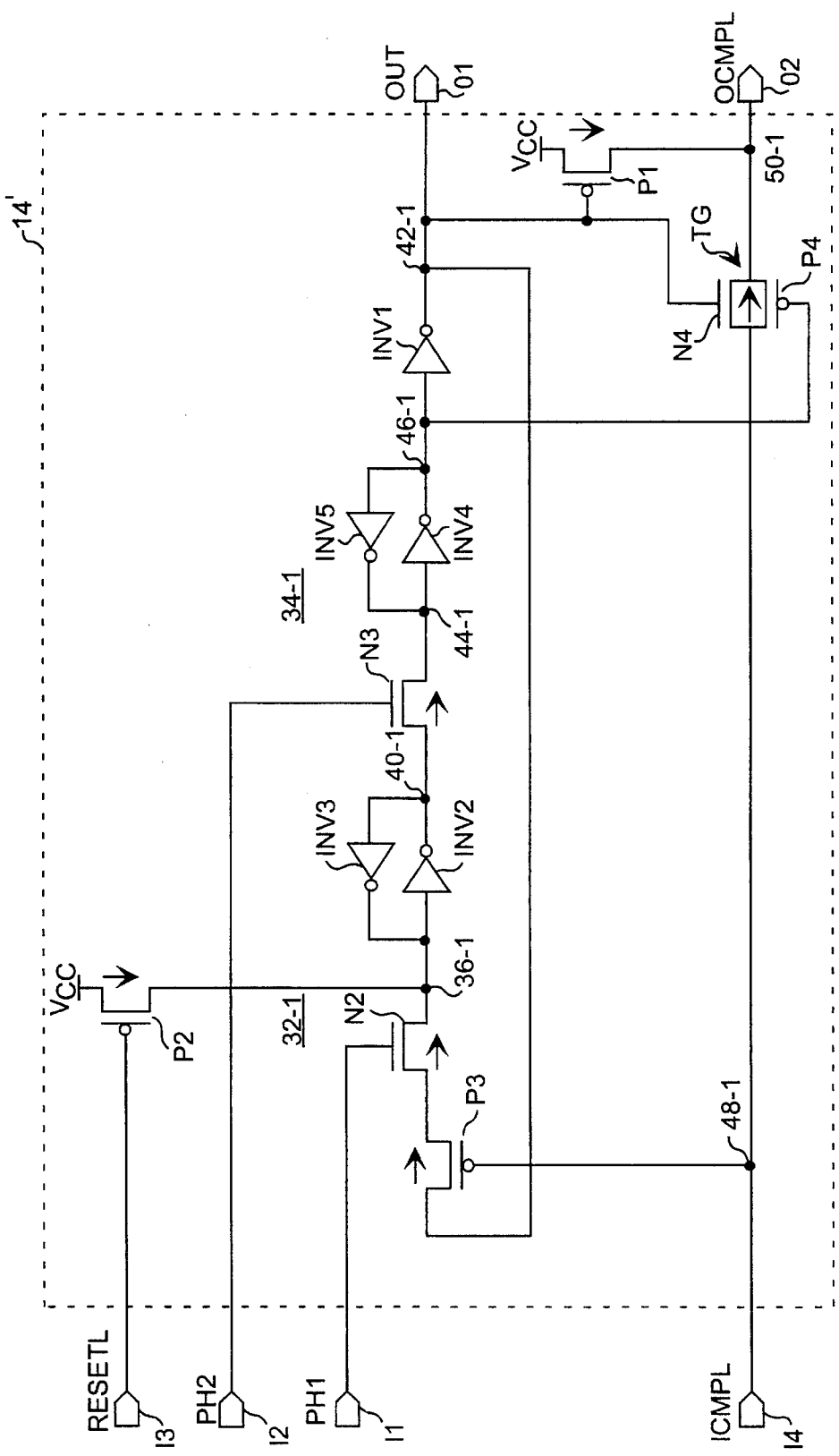
FIG. 4 is a schematic circuit diagram of a counter cell according to a first embodiment of the invention.

In FIG. 4, there is shown a schematic circuit diagram of a counter cell for use in each of the blocks 14-1', 14-2', 14-3' and 14-4' of the counter circuit 10' in FIG. 3 of the present invention. In this schematic circuit diagram, the input and output terminals which are similar to those shown in FIG. 3 are similarly numbered or labeled. The counter stage 14' includes a first clocked half-latch 32-1, a second clocked half-latch 34-1, an inverter INV1, a transmission gate TG, a pull-up P-channel MOS transistor P1, a reset P-channel MOS transistor P2, and an inhibit P-channel MOS transistor P3.

The first clocked half-latch 32-1 includes a first N-channel pass transistor N2 and inverters INV2, INV3. The transistor N2 has its drain connected to a node 36-1 and to the input of the inverter INV2. The gate of the transistor N2 is connected to input terminal I1 for receiving the first clock phase signal PH1. The output of the inverter INV2 is connected to a node 40-1 and to the input of the inverter INV3. The output of the inverter INV3 is connected to the input of the inverter INV2. The source of the transistor N2 is connected to the drain of transistor P3.

The second clocked half-latch 34-1 includes a second N-channel pass transistor N3, and inverters INV4, INV5. The transistor N3 has its drain connected to a node 44-1 and to the input of the inverter INV4. The gate of the transistor N3 is connected to the input terminal I2 for receiving the second clock phase signal PH2. The output of the inverter INV4 is connected to a node 46-1 and to the input of the inverter INV5. The output of the inverter INV5 is connected to the input of the inverter INV4. The source of the transistor N3 is connected to the output of the inverter INV2 at the node 40-1. Each of the inverters INV1 through INV5 is a conventional CMOS inverter comprised of a P-channel MOS transistor and an N-channel MOS transistor which have gate electrodes connected together to define its input and drains connected together to form its output.

The transmission gate TG is formed of a P-channel MOS transistor P4 and an N-channel MOS transistor N4. The sources of the transistors P4 and N4 are connected to its input node 48-1, and the drains thereof are connected to its output node 50-1. The input node 48-1 is tied to the input terminal I4 for receiving the input complement signal ICMPL. The output node 50-1 is joined to the output terminal O2 for providing the output complement signal OCMPL to the next stage. The gate electrode of the transistor P4 is connected to the output of the inverter INV4 at the node 46-1, and the gate electrode of the transistor N4 is connected to the output of the inverter INV1 at the output node 42-1. The pull-up transistor P1 has its source connected to a supply potential Vcc, which is typically at +5.0 volts, and its drain connected to the output terminal O2 at the node 50-1. The gate of the transistor P1 is also connected to the output node 42-1.

The reset transistor P2 has its source connected to the supply potential Vcc and its drain connected to the node 36-1. The gate of the transistor P2 is connected to the input terminal I3 for receiving the complement RESETL of the reset signal. The inhibit transistor P3 has its drain connected to the source of transistor N2 and its source connected to the output of inverter INV1 of output node 42-1. The gate of the transistor P3 is connected to the input terminal I4 via the node 48-1 for receiving the input complement signal ICMPL. Transistor N2 is connected to the input of terminal I1 for receiving the first clock phase signal PH1.

With ICMPL applied to the gate of transistor P3, PH1 applied to the gate of transistor N2, the drain of P3 connected to the source of N2, and output node 42-1 connected to the source of transistor P3, the control circuitry according to the invention can perform control with input signals PH1, ICMPL and transistor P3. This is an advantage over the control circuitry in FIG. 1 which needs input signals PH1, PH1L, ICMPL and transistors P3 and N1 to achieve the same control. The circuitry according to the invention results in a savings of 1 transistor per counter cell. Thus, according to the invention, N transistors are saved in an N-bit counter circuit having N counter cells in a series arrangement.

Figure 1:
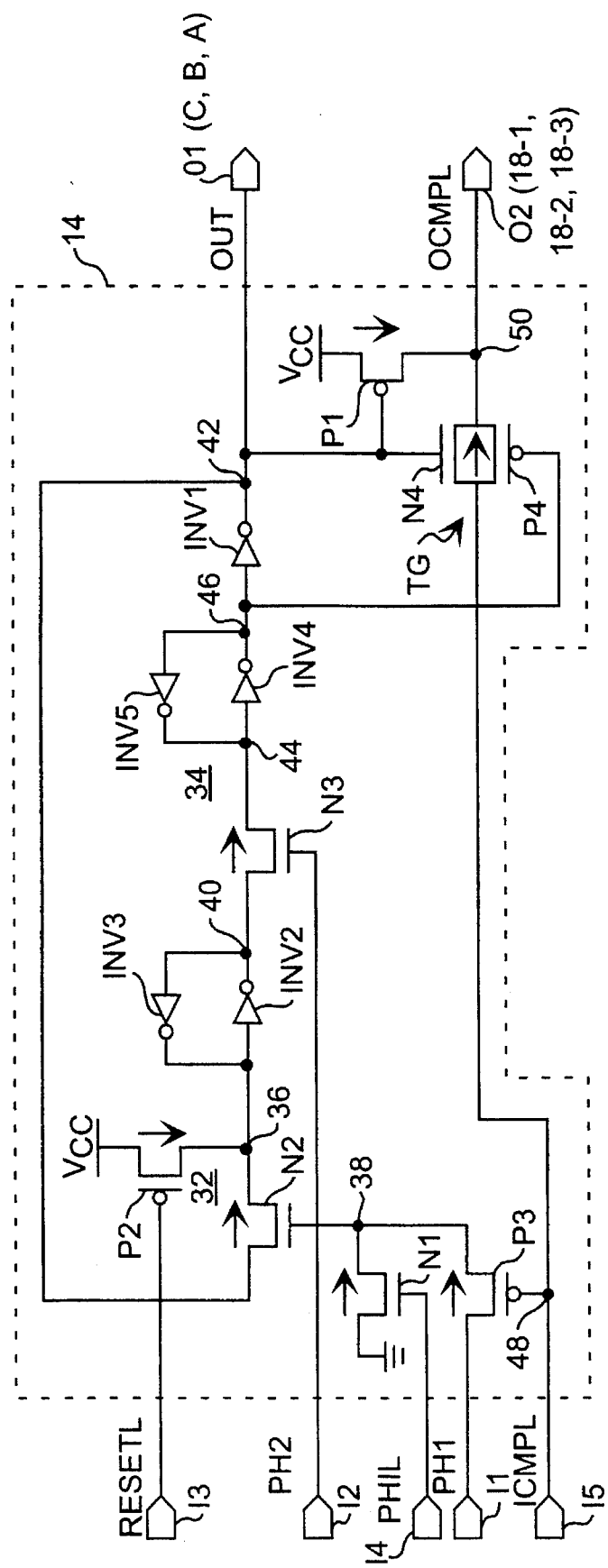
FIG. 1 is a schematic circuit diagram of a conventional counter cell.

In the control cell according to the invention, when ICMPL is logically Low, transistor P3 is conductive, and the signal at node 42-1 is transferred to the drain of transistor N2. When PH1 is High, transistor N2 is conductive, and the input at the source of PH1 is transferred to the drain of N2, corresponding to node 36-1 of FIG. 4. In all other cases, a signal is not latched to the drain of transistor N2. Therefore, the functionality of the two-transistor control circuit (P3, N1) in FIG. 1 is instead accomplished by a one-transistor control circuit (P3), with a corresponding change in the connection of the control circuit to the rest of the counter cell. Specifically, in the counter cell 14 shown in FIG. 1, the drain of transistor P3 is connected to the gate of transistor N2, which is used in the first clocked half-latch. In the control cell 14' according to the invention, however, not only is transistor N1 not needed, but as can be seen from FIG. 3, the drain of transistor P3 is connected to the source of transistor N2.

FIGS. 5(a) through 5(g) are timing diagrams which are useful in understanding the operation of the 4-bit up-counter circuit 10' of FIG. 3. In describing the counting sequence of the counter circuit 10' of FIG. 3, reference will also be made simultaneously to FIGS. 3 and 4. As can be seen from FIG. 5(g), the reset signal RESET applied to the input terminal I3 is at a logic "1" level prior to time t0. Thus, the transmission gate T1 is open so that the first clock phase signal PH1 is prevented from being applied to the input terminals of the counter stages 14-1', 14-2', 14-3' and 14-4'. This reset signal RESET is also inverted by the inverter T3 so as to apply a low or "0" logic level to the gates of the reset transistors P2 in the counter stages 14-1', 14-2', 14-3' and 14-4'. This ensures that the output bits ABCD will be reset to store all zeroes (0000) before the counting operation is permitted to begin. Accordingly, the input complement signal ICMPL on the output line to the second stage 14-2' will be at a high logic level. Further, the input complement signal ICMPL on the respective lines from the second and third counter stages 14-2' and 14-3' will also be at the high logic level since all the pull-up transistors P1 will be rendered conductive.

At time t0, the reset signal RESET makes a high-to-low transition which closes the transmission gate T1 in order to initialize the counting. When the first clock phase signal PH1 goes high at time t1, the half-latch 32-1 (FIG. 4) will be transparent, so as to permit the low logic level at the output of the inverter INV1 (bit D=0), which is passed through transistor N2, to reach the output of the inverter INV2 at the node 40-1. Due to the inverter INV2, the node 40-1 will be at a high or "1" logic level. It should be noted that this high level of the first clock phase signal PH1 at the time t1 does not reach the gates of the corresponding pass transistors N2 (FIG. 3) in the counter stages 14-2', 14-3' and 14-4' since the input complement signal ICMPL on the respective input terminals will be at the high level, thereby rendering the inhibit transistors P3 to be nonconductive. Consequently, the output bits B, C and D will remain unchanged.

Figure 5:
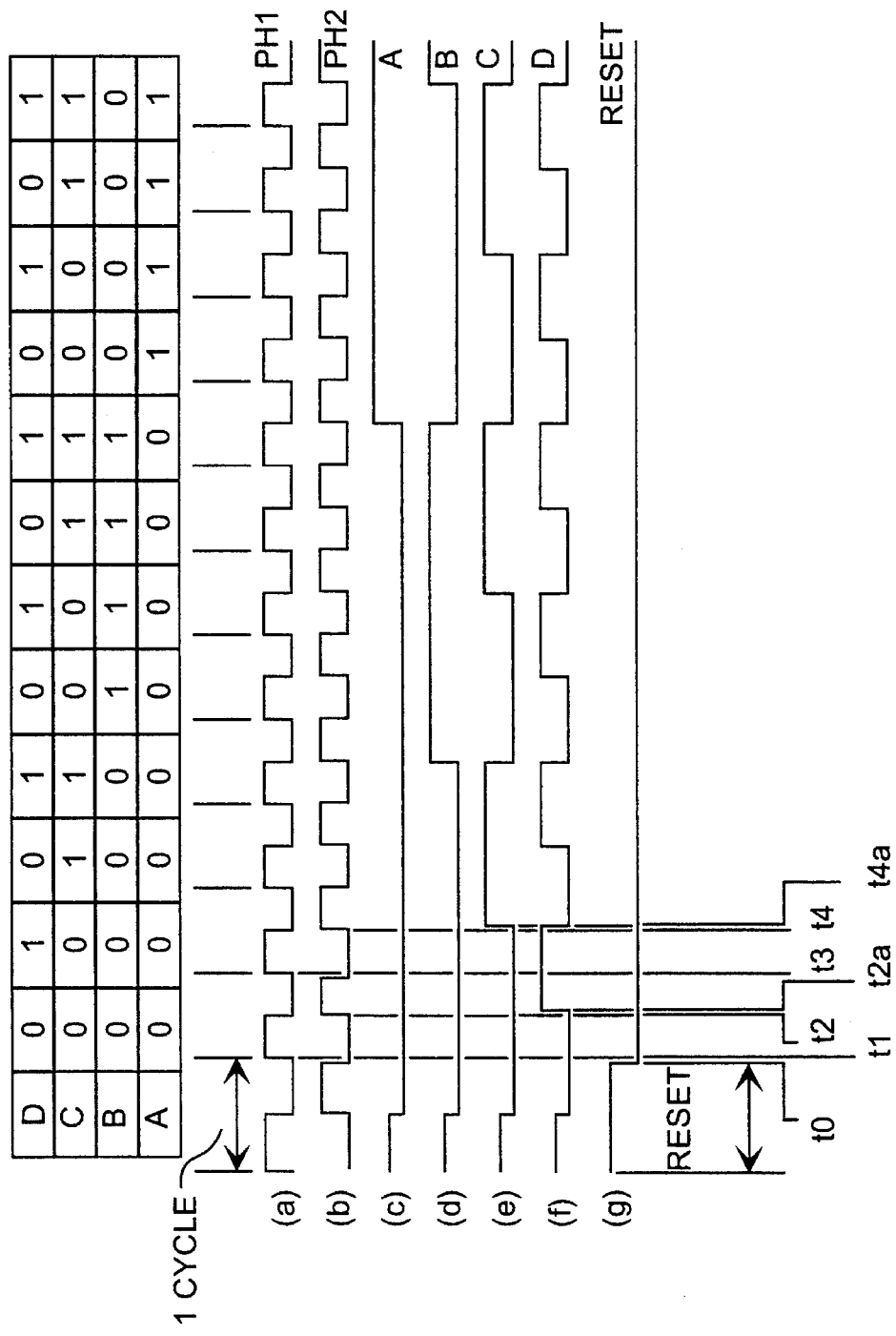
FIG. 5 is timing diagrams useful in understanding the operation of the counter circuit of FIG. 3 and 4.

Referring back to FIG. 4, when the second clock phase signal PH2 goes high at time t2, as depicted in FIG. 5(b), the half-latch 34-1 will be transparent so as to allow the high logic level at the node 40-1, which is passed through the pass transistor N3, to reach the output of the inverter INV4. Due to the inverter INV4, the node 46-1 will be at a low logic level. Further, this low logic level will be inverted again by the inverter INV1 so as to toggle the output bit D at time t2a, as shown in FIG. 5(f). As a result, the output state of the counter stage 14-1' will be D=1 and the output complement signal OCMPL that is output from counter stage 14-1' will be at a low logic level, which is the input complement signal ICMPL for the counter stage 14-2'. Therefore, the output bits ABCD will be 0001 at the time t2a, which are illustrated in respective signals in FIG. 5(c) through 5(f).

At time t3 when the next first clock phase signal PH1 goes high, the output bit D being high will again be passed to the node 40-1 (FIG. 4). At time t4 when the next second clock phase signal PH2 goes high, the output bit D will be toggled to a low logic level at time t4a in FIG. 5(f). Simultaneously, at the time t3, the high level of the first clock phase signal PH1 will also be transferred to the gate of the transistor N2 in the counter stage 14-2' (FIG. 3) since its input complement signal will be at a low logic level, thereby rendering the input transistor P3 to be conductive. As a result, the output bit C being low will be passed to the node 40-1 (FIG. 3). At the time t4, the high level of the second clock phase signal PH2 will also cause the output bit C to be toggled to a high level at the same time t4a, as shown in FIG. 5(e). Thus, the output state of the counter stage 14-2' will be C=1 and the output complement signal OCMPL from the counter stage 14-2' will be equal to the input complement signal ICMPL from the counter stage 14-1' since the transistor P1 (FIG. 3) will be turned off and the transmission gate TG will be closed.

It should be apparent to those skilled in the art that a similar analysis can be made on the counter stages 14-1', 14-2', 14-3' and 14-4' in the counter circuit 10' of FIG. 4 for each of the subsequent cycles of the clock phase signal PH1 in order to obtain the corresponding states of the output bits ABCD illustrated in FIGS. 5(c)-5(f), respectively. It should also be clear that the input complement signal ICMPL functions as a control signal to determine whether or not to complement or change (toggle) the current state of a particular output bit in the counter stages 14-2', 14-3' and 14-4'. If ICMPL=0, then the particular bit will be allowed to toggle. If ICMPL=1, then this particular bit will be prohibited from changing its state and will remain in its present state. By using this approach, along with the new control circuitry which does not require a discharging transistor N1, the number of circuit components that have been used for implementing each of the counter stages have been reduced. In comparing FIG. 4 of the present counter cell 14' with the counter cell 14 of FIG. 1, it can be seen that there is a saving of one transistor per cell.

From the foregoing detailed description, it can thus be seen that the present invention provides an improved counter cell which includes a latch circuit, a control circuit, and a pull-up circuit. Further, any number of such counter cells may be connected to form an N-bit counter circuit, the counter cells being constructed with an improved control circuit so as to reduce the required amount of chip area.

Figure 6:
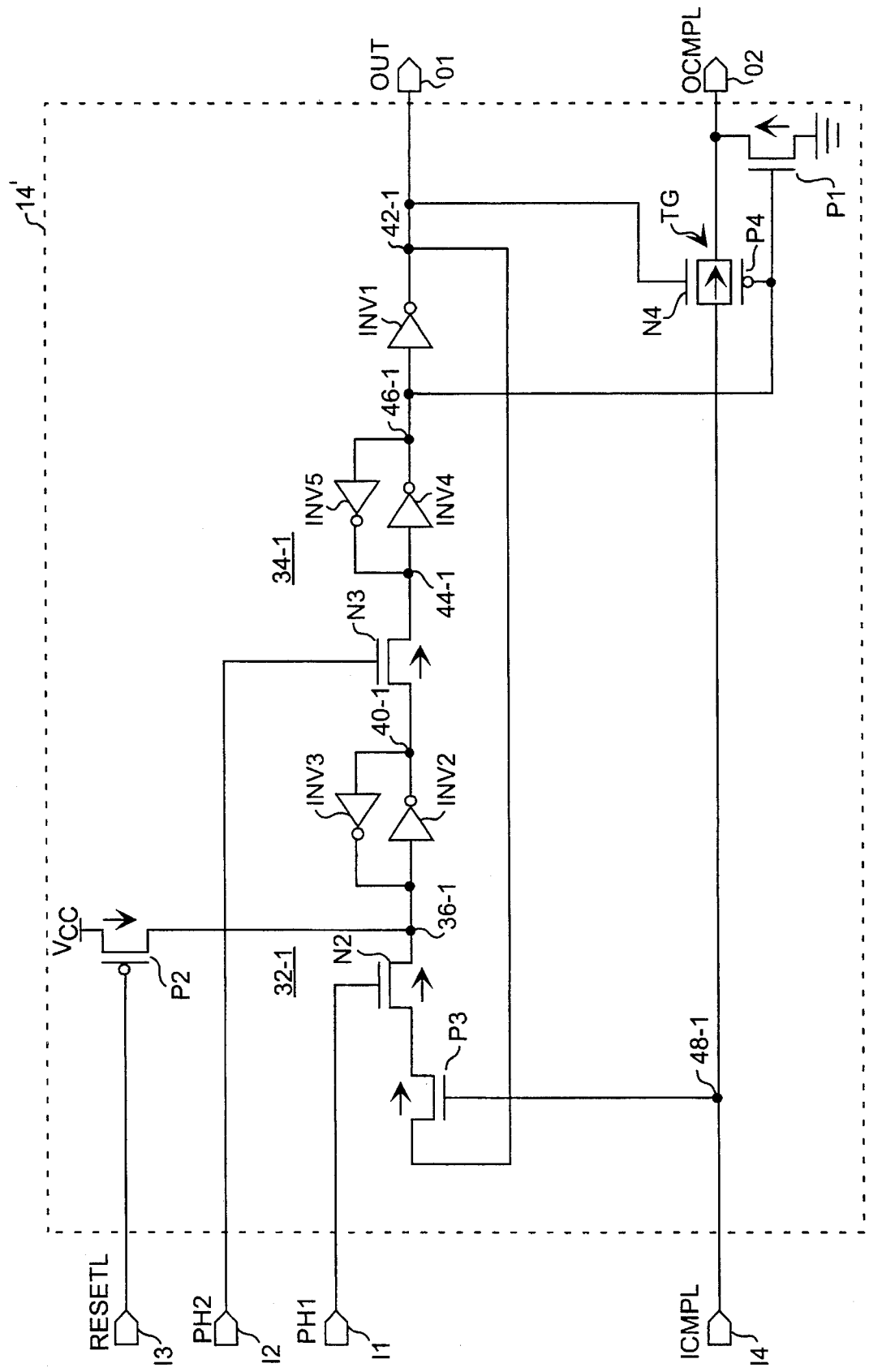
FIG. 6 is a schematic diagram of a counter cell according to a second embodiment of the invention.

A second embodiment of the counter cell according to the invention is shown in FIG. 6. In this Figure, the counter cell operates in an active Low condition, as opposed to an active High condition as is the case in the embodiment shown in FIG. 4. In this embodiment, inhibit transistor P3 is an N-channel MOS transistor, wherein the inhibit transistor in the first embodiment as shown in FIG. 4 is a P-channel MOS transistor. Also, in FIG. 6, the pull-up transistor P1 of FIG. 4 has been replaced by the pull-down transistor P1, which is an N-channel MOS transistor. Note that the source of the pull-down transistor P1 is connected to a low reference potential (ground).

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiment falling within the scope of the appended claims.

What is claimed is:

1. A counter cell comprising:

a first clocked half-latch formed of a first pass transistor and a pair of first and second inverters;

a second clocked half-latch formed of a second pass transistor and a pair of third and fourth inverters;

a fifth inverter having an input connected to said second clocked half-latch and an output connected to a first output terminal;

said first pass transistor having a drain connected to an input of said first inverter and a gate connected to a first input terminal for receiving a first clock phase signal, said first inverter having an output connected to an input of said second inverter, said second inverter having an output connected to said input of said first inverter;

said second pass transistor having a source connected to an output of said first inverter, a gate connected to a second input terminal for receiving a second clock phase signal, and a drain connected to an input of said third inverter, said third inverter having an output connected to an input of said fourth inverter and to said input of said fifth inverter, said fourth inverter having an output connected to said input of said third inverter;

an inhibit transistor having a source connected to said output of said fifth inverter, a drain connected to a source of said first pass transistor, and a gate connected to a third input terminal for receiving an input complement signal;

a transmission gate including a P-channel transistor and an N-channel transistor having sources which are connected to said gate of said inhibit transistor and having drains which are connected to a second output terminal to provide an output complement signal, said P-channel transistor having a gate connected to said output of said third inverter, and said N-channel transistor having a gate connected to said first output terminal; and a pull-up transistor having a source connected to a supply potential and a drain connected to said second output terminal, a gate of said pull-up transistor being connected to said first output terminal.

2. A counter cell as recited in claim 1, further comprising a reset transistor having a source connected to the supply potential, and a drain connected to the input of said first inverter, a gate of said reset transistor being connected to a fourth input terminal for receiving the complement of a reset signal.

3. A counter cell as recited in claim 1, wherein said first and second pass transistors are comprised of N-channel MOS transistors.

4. A counter cell as recited in claim 1, wherein said pull-up and inhibit transistors are comprised of P-channel MOS transistors.

5. A counter circuit having a plurality of counter stages, each counter stage comprising:

a first clocked half-latch formed of a first pass transistor and a pair of first and second inverters;

a second clocked half-latch formed of a second pass transistor and a pair of third and fourth inverters;

a fifth inverter having an input connected to said second clocked half-latch and an output connected to a first output terminal;

said first pass transistor having a drain connected to an input of said first inverter and a gate connected to a first input terminal for receiving a first clock phase signal, said first inverter having an output connected to an input of said second inverter, said second inverter having an output connected to said input of said first inverter;

said second pass transistor having a source connected to an output of said first inverter, a gate connected to a second input terminal for receiving a second clock phase signal, and a drain connected to an input of said third inverter, said third inverter having an output connected to an input of said fourth inverter and to said input of said fifth inverter, said fourth inverter having an output connected to said input of said third inverter;

an inhibit transistor having a source connected to said output of said fifth inverter, a drain connected to a source of said first pass transistor, and a gate connected to a third input terminal for receiving an input complement signal;

a transmission gate including a P-channel transistor and an N-channel transistor having sources which are connected to said gate of said inhibit transistor and having drains which are connected to a second output terminal to provide an output complement signal, said P-channel transistor having a gate connected to said output of said third inverter, and said N-channel transistor having a gate connected to said first output terminal; and a pull-up transistor having a source connected to a supply potential and a drain connected to said second output terminal, a gate of said pull-up transistor being connected to said first output terminal.

6. A counter circuit as recited in claim 5, further comprising a reset transistor having a source connected to the supply potential, and a drain connected to the input of said first inverter, a gate of said reset transistor being connected to a fourth input terminal for receiving the complement of a reset signal.

7. A counter circuit as recited in claim 5, wherein said first and second pass transistors are comprised of N-channel MOS transistors.

8. A counter circuit as recited in claim 5, wherein said pull-up and inhibit transistors are comprised of P-channel MOS transistors.

9. A counter circuit as recited in claim 5, wherein a plurality of said counter stages are connected together to form an N-bit counter circuit.

10. A counter circuit as recited in claim 5, wherein a plurality of counter stages are connected together to form a 4-bit up-counter circuit.

11. A counter circuit as recited in claim 5, wherein said inverters are comprised of CMOS inverters, each being formed of a P-channel transistor and an N-channel transistor.

12. A counter cell comprising:

a first clocked half-latch formed of a first pass transistor and a pair of first and second inverters;

a second clocked half-latch formed of a second pass transistor and a pair of third and fourth inverters;

a fifth inverter having an input connected to said second clocked half-latch and an output connected to a first output terminal;

said first pass transistor having a drain connected to an input of said first inverter and a gate connected to a first input terminal for receiving a first clock phase signal, said first inverter having an output connected to an input of said second inverter, said second inverter having an output connected to said input of said first inverter;

said second pass transistor having a source connected to an output of said first inverter, a gate connected to a second input terminal for receiving a second clock phase signal, and a drain connected to an input of said third inverter, said third inverter having an output connected to an input of said fourth inverter and to said input of said fifth inverter, said fourth inverter having an output connected to said input of said third inverter;

an inhibit transistor having a source connected to said output of said fifth inverter, a drain connected to a source of said first pass transistor, and a gate connected to a third input terminal for receiving an input complement signal;

a transmission gate including a P-channel transistor and an N-channel transistor having sources which are connected to said gate of said inhibit transistor and having drains which are connected to a second output terminal to provide an output complement signal, said P-channel transistor having a gate connected to said output of said third inverter, and said N-channel transistor having a gate connected to said first output terminal; and a pull-down transistor having a source connected to a low reference potential and a drain connected to said second output terminal, a gate of said pull-up transistor being connected to said first output terminal.

13. A counter cell as recited in claim 12, further comprising a reset transistor having a source connected to the supply potential, and a drain connected to the input of said first inverter, a gate of said reset transistor being connected to a fourth input terminal for receiving the complement of a reset signal.

14. A counter cell as recited in claim 12, wherein said first and second pass transistors are comprised of N-channel MOS transistors.

15. A counter cell as recited in claim 12, wherein said pull-down and inhibit transistors are comprised of N-channel MOS transistors.

16. A counter circuit having a plurality of counter stages, each counter stage comprising:

a first clocked half-latch formed of a first pass transistor and a pair of first and second inverters;

a second clocked half-latch formed of a second pass transistor and a pair of third and fourth inverters;

a fifth inverter having an input connected to said second clocked half-latch and an output connected to a first output terminal;

said first pass transistor having a drain connected to an input of said first inverter and a gate connected to a first input terminal for receiving a first clock phase signal, said first inverter having an output connected to an input of said second inverter, said second inverter having an output connected to said input of said first inverter;

said second pass transistor having a source connected to an output of said first inverter, a gate connected to a second input terminal for receiving a second clock phase signal, and a drain connected to an input of said third inverter, said third inverter having an output connected to an input of said fourth inverter and to said input of said fifth inverter, said fourth inverter having an output connected to said input of said third inverter;

an inhibit transistor having a source connected to said output of said fifth inverter, a drain connected to a source of said first pass transistor, and a gate connected to a third input terminal for receiving an input complement signal;

a transmission gate including a P-channel transistor and an N-channel transistor having sources which are connected to said gate of said inhibit transistor and having drains which are connected to a second output terminal to provide an output complement signal, said P-channel transistor having a gate connected to said output of said third inverter, and said N-channel transistor having a gate connected to said first output terminal; and a pull-down transistor having a source connected to a low reference potential and a drain connected to said second output terminal, a gate of said pull-up transistor being connected to said first output terminal.

17. A counter circuit as recited in claim 16, further comprising a reset transistor having a source connected to the supply potential, and a drain connected to the input of said first inverter, a gate of said reset transistor being connected to a fourth input terminal for receiving the complement of a reset signal.

18. A counter circuit as recited in claim 16, wherein said first and second pass transistors are comprised of N-channel MOS transistors.

19. A counter circuit as recited in claim 16, wherein said pull-up and inhibit transistors are comprised of N-channel MOS transistors.

20. A counter circuit as recited in claim 16, wherein a plurality of said counter stages are connected together to form an N-bit counter circuit.

21. A counter circuit as recited in claim 16, wherein a plurality of counter stages are connected together to form a 4-bit up-counter circuit.

22. A counter circuit as recited in claim 16, wherein said inverters are comprised of CMOS inverters, each being formed of a P-channel transistor and an N-channel transistor.

* * * * *

UNITED STATES PATENT AND TRADEMARK OFFICE
CERTIFICATE OF CORRECTION

PATENT NO. : 5,495,513
DATED : February 27, 1996
INVENTOR(S) : Sergio R. RAMIREZ et al.

It is certified that error appears in the above-indentified patent and that said Letters Patent is hereby corrected as shown below:

On the cover page, item [75] Inventors, "Imran Baoai" should read --Imran Baqai--.

Signed and Sealed this

Third Day of December, 1996

*Attest:*

BRUCE LEHMAN

*Attesting Officer*     *Commissioner of Patents and Trademarks*